United States Patent
Kashiyama

(10) Patent No.: US 10,507,484 B2
(45) Date of Patent: Dec. 17, 2019

(54) PUMP APPARATUS AND SUBSTRATE TREATING APPARATUS

(71) Applicant: SCREEN Holdings Co., Ltd., Kyoto (JP)

(72) Inventor: Masahito Kashiyama, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 307 days.

(21) Appl. No.: 15/429,610

(22) Filed: Feb. 10, 2017

(65) Prior Publication Data

US 2017/0232460 A1     Aug. 17, 2017

(30) Foreign Application Priority Data

Feb. 16, 2016    (JP) .................................. 2016-026852

(51) Int. Cl.
| | |
|---|---|
| *B05B 15/40* | (2018.01) |
| *B05B 9/04* | (2006.01) |
| *F04B 17/03* | (2006.01) |
| *F04B 53/06* | (2006.01) |
| *F04B 53/20* | (2006.01) |
| *H01L 21/67* | (2006.01) |

(52) U.S. Cl.
CPC ............ *B05B 15/40* (2018.02); *B05B 9/0413* (2013.01); *F04B 17/03* (2013.01); *F04B 53/06* (2013.01); *F04B 53/20* (2013.01); *H01L 21/6715* (2013.01); *H01L 21/67017* (2013.01); *H01L 21/67051* (2013.01)

(58) Field of Classification Search
None
See application file for complete search history.

(56) References Cited

U.S. PATENT DOCUMENTS

| 6,171,367 B1 | 1/2001 | Peng et al. ....................... 95/46 |
| 6,251,293 B1 | 6/2001 | Snodgrass et al. ........... 210/767 |
| 2005/0016449 A1 | 1/2005 | Chen et al. .................... 118/666 |

(Continued)

FOREIGN PATENT DOCUMENTS

| JP | H06-267837 A | 9/1994 |
| JP | 2003-181364 A | 7/2003 |

(Continued)

OTHER PUBLICATIONS

Office Action dated Sep. 20, 2018 for corresponding Korean Patent Application No. 10-2016-0183202.

(Continued)

*Primary Examiner* — Charles Capozzi
(74) *Attorney, Agent, or Firm* — Ostrolenk Faber LLP

(57) ABSTRACT

Provided is a pump apparatus, having an upstream pump, a filter, and a downstream pump being inserted into a processing liquid flow path in this order. The downstream pump has an inlet higher in level than an outlet of the upstream pump and higher in level than an outlet of the filter. That is, the downstream pump is disposed higher in level than the upstream pump and the filter. Accordingly, this allows a processing liquid to flow upward. Even when air bubbles are generated in the processing liquid, buoyancy causes the air bubbles to move upward in the processing liquid flow path and collect the air bubbles on a downstream side. Consequently, the air bubbles are readily vented from the processing liquid flow path.

7 Claims, 4 Drawing Sheets

(56) References Cited

U.S. PATENT DOCUMENTS

| | | | |
|---|---|---|---|
| 2005/0175472 A1* | 8/2005 | Udagawa | B01D 19/0031 417/313 |
| 2005/0238504 A1 | 10/2005 | Yajima | 417/394 |
| 2008/0169230 A1* | 7/2008 | Nakagawa | B01D 19/0042 210/188 |
| 2012/0241469 A1 | 9/2012 | Takeishi | 222/1 |
| 2013/0068324 A1 | 3/2013 | Furusho et al. | 137/544 |
| 2015/0048035 A1 | 2/2015 | Liao | 210/767 |
| 2015/0090340 A1 | 4/2015 | Takayanagi et al. | 137/1 |
| 2015/0092167 A1 | 4/2015 | Terashita et al. | 355/30 |
| 2017/0014873 A1 | 1/2017 | Higuchi et al. | 134/22.11 |

FOREIGN PATENT DOCUMENTS

| | | |
|---|---|---|
| JP | 2005-305396 A | 11/2005 |
| JP | 5079516 B2 | 11/2012 |
| JP | 5366555 B2 | 12/2013 |
| JP | 5451515 B2 | 3/2014 |
| JP | 2015-72985 A | 4/2015 |
| JP | 2015-073007 A | 4/2015 |
| TW | 201525129 A | 7/2015 |
| TW | M506652 U | 8/2015 |
| TW | 201542301 A | 11/2015 |
| TW | M514103 U | 12/2015 |
| TW | 201601213 A | 1/2016 |
| WO | WO 2006/057957 A2 | 6/2006 |
| WO | WO 2007/067358 A2 | 6/2007 |

OTHER PUBLICATIONS

Office Action dated Apr. 30, 2018 for corresponding Taiwan Patent Application No. 106104616.
Office Action and Search Report dated Aug. 3, 2017 for corresponding Taiwan Patent Application No. 106104616.
Notice of Allowance dated May 17, 2019 for corresponding Korean Patent Application No. 10-2016-0183202.
Office Action dated Oct. 1, 2019 for corresponding Japanese Patent Application No. 2016-026852.

* cited by examiner

PUMP APPARATUS AND SUBSTRATE TREATING APPARATUS

CROSS-REFERENCE TO RELATED APPLICATIONS

This application claims priority to Japanese Patent Application No. 2016-026852 filed Feb. 16, 2016 the subject matter of which is incorporated herein by reference in entirety.

TECHNICAL FIELD

The present invention relates to a pump apparatus that supplies a processing liquid for processing a substrate, such as a semiconductor substrate, a glass substrate for liquid crystal display, a glass substrate for photomask, and an optical disk substrate, and a substrate treating apparatus.

BACKGROUND ART

A substrate treating apparatus includes a holding rotator, nozzles, and a pump apparatus. See, for example, Japanese Patent No. 5451515. The holding rotator holds a substrate in a substantially horizontal attitude, and rotates the held substrate. The nozzles each dispense a processing liquid to the substrate held with the holding rotator. The pump apparatus supplies the processing liquid to the nozzles.

As illustrated in FIG. 1, the pump apparatus 100 include an upstream pump 101, a downstream pump 102, and a filter 104 inserted into a processing liquid pipe 103. The upstream pump 101 and the downstream pump 102 are disposed in parallel in a horizontal direction. See, for example, Japanese Patent No. 5366555 and 5079516, and U.S. Pat. No. 6,251,293. Here, FIG. 1 indicates an upward/downward (vertical) direction with an arrow AR.

SUMMARY OF INVENTION

Technical Problem

However, in such a case of FIG. 1 that the upstream pump 101 and the downstream pump 102 are disposed in parallel in the horizontal direction, air bubbles (gas) in the processing liquid are less likely to be vented from the pump apparatus 100. Moreover, as illustrates in FIG. 1 by chain double-dashed lines, air bubbles are also less likely to be vented at a portion BB where the processing liquid pipe 103 is directed downward. When air bubbles are less likely to be vented, a processing liquid with air bubbles may be supplied to the substrate during substrate processing, which is an undesirable phenomenon.

The present invention has been made regarding the state of the art noted above, and its one object is to provide a pump apparatus and a substrate treating apparatus that allow easy vent of air bubbles in a supply path for a processing liquid.

Solution to Problem

The present invention is constituted as stated below to achieve the above object. One aspect of the present invention provides a pump apparatus for supplying a processing liquid. The pump apparatus includes a filter inserted into a processing liquid flow path through which the processing liquid flows; an upstream pump disposed upstream of the filter and inserted into the processing liquid flow path; and a downstream pump disposed downstream of the filter and inserted into the processing liquid flow path, the downstream pump having an inlet higher in level than an outlet of the upstream pump and higher in level than an outlet of the filter.

With the pump apparatus according to the aspect of the present invention, the upstream pump, the filter, and the downstream pump are inserted into the processing liquid flow path in this order. The downstream pump has the inlet higher in level than the outlet of the upstream pump and higher in level than the outlet of the filter. That is, the downstream pump is disposed higher in level than the upstream pump and the filter. Accordingly, this allows the processing liquid to flow upward. Even when air bubbles are generated in the processing liquid, buoyancy causes the air bubbles to move upward and collect the air bubbles on a downstream side. Consequently, the air bubbles are readily removable from the processing liquid flow path.

Moreover, it is preferred in the above pump apparatus that the processing liquid flow path is connected to the inlet of the downstream pump while extending from the outlet of the filter at least either horizontally or upward without extending downward. This causes the air bubbles to be less likely to remain between the filter and the downstream pump. Consequently, the air bubbles are readily removable from the processing liquid flow path.

Moreover, it is preferred in the pump apparatus that the downstream pump includes a supply outlet connected to the processing liquid flow path, and the supply outlet is disposed lower in level than an upper end of an intra-pump flow path of the downstream pump. Here, air bubbles in the processing liquid float adjacent to the upper end. Accordingly, the air bubbles are able to be prevented from flowing out of the supply outlet disposed lower in level than the upper end of the intra-pump flow path.

Moreover, it is preferred in the pump apparatus that the filter includes a vent that exhausts air bubbles. This allows exhaust of the air bubbles in the processing liquid in midstream of the processing liquid flow path.

Moreover, it is preferred in the pump apparatus that a return flow path is connected between the downstream pump and the upstream pump or a front stage of the upstream pump for returning the processing liquid from an return outlet of the downstream pump to the upstream pump or the front stage of the upstream pump, and that the return outlet is disposed higher in level than a supply outlet of the downstream pump. This allows the air bubbles to return from the return outlet of the downstream pump to the upstream pump or to the front stage of the upstream pump. In other words, the processing liquid is circulatable among the upstream pump, the filter, and the downstream pump. Consequently, air bubbles are removable by returning the processing liquid containing the air bubbles in the downstream pump to the upstream pump and passing the processing liquid again through the filter.

Moreover, it is preferred in the pump apparatus that the return outlet is disposed at a level to contact the upper end of the intra-pump flow path of the downstream pump. Here, the return outlet of the downstream pump is disposed at a level to contact the upper end of the intra-pump flow path. Accordingly, the air bubbles in the processing liquid that floats and are collected adjacent to the upper end of the intra-pump flow path are able to flow into the return flow path.

Moreover, it is preferred in the pump apparatus that the outlet of the upstream pump is disposed higher in level than the inlet of the upstream pump. This causes the air bubbles in the upstream pump to be vented readily.

Moreover, it is preferred in the pump apparatus that the inlet of the filter is disposed higher in level than the outlet of the upstream pump. This causes the filter to be disposed higher in level than the upstream pump, leading to ready vent of the air bubbles from the upstream pump to the filter. Accordingly, the air bubbles are able to be prevented from remaining in midstream of the processing liquid flow path.

Another aspect of the present invention provides a substrate treating apparatus for treating a substrate. The substrate treating apparatus includes a nozzle that dispenses a processing liquid to the substrate; and a pump apparatus that supplies the processing liquid to the nozzle. The pump apparatus includes a filter inserted into a processing liquid flow path through which the processing liquid flows; an upstream pump disposed upstream of the filter and inserted into the processing liquid flow path; and a downstream pump disposed downstream of the filter and inserted into the processing liquid flow path. The downstream pump has an inlet higher in level than an outlet of the upstream pump and higher in level than an outlet of the filter.

With the substrate treating apparatus according to the other aspect of the present invention, the upstream pump, the filter, and the downstream pump are inserted into the processing liquid flow path in this order. The downstream pump has the inlet higher in level than the outlet of the upstream pump and higher in level than the outlet of the filter. That is, the downstream pump is disposed higher in level than the upstream pump and the filter. Accordingly, this allows the processing liquid to flow upward. Even when air bubbles are generated in the processing liquid, buoyancy causes the air bubbles to move upward in the processing liquid flow path and collect the air bubbles on a downstream side. Consequently, the air bubbles are readily vented from the processing liquid flow path.

Advantageous Effects of Invention

The pump apparatus and the substrate treating apparatus according to the aspects of the present invention allow the processing liquid to flow upward, achieving suppressed remaining of the air bubbles in midstream of the supply path. Consequently, the air bubbles are readily vented from the supply path for the processing liquid.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

DESCRIPTION OF EMBODIMENTS

Figure 1:
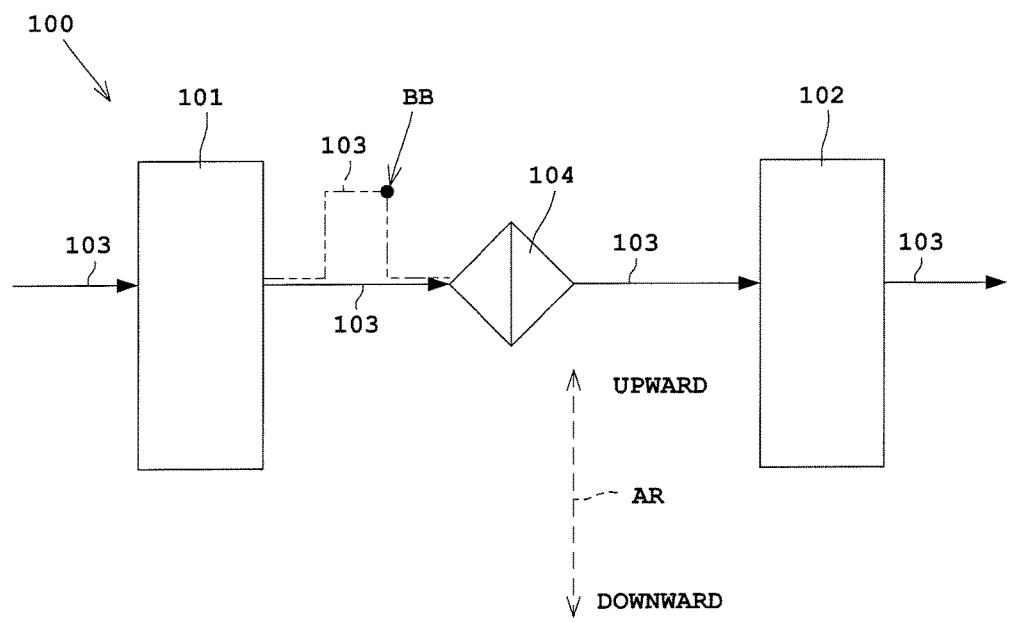
FIG. 1 illustrates a currently-used pump apparatus and a problem of the apparatus to be solved.
Figure 2:
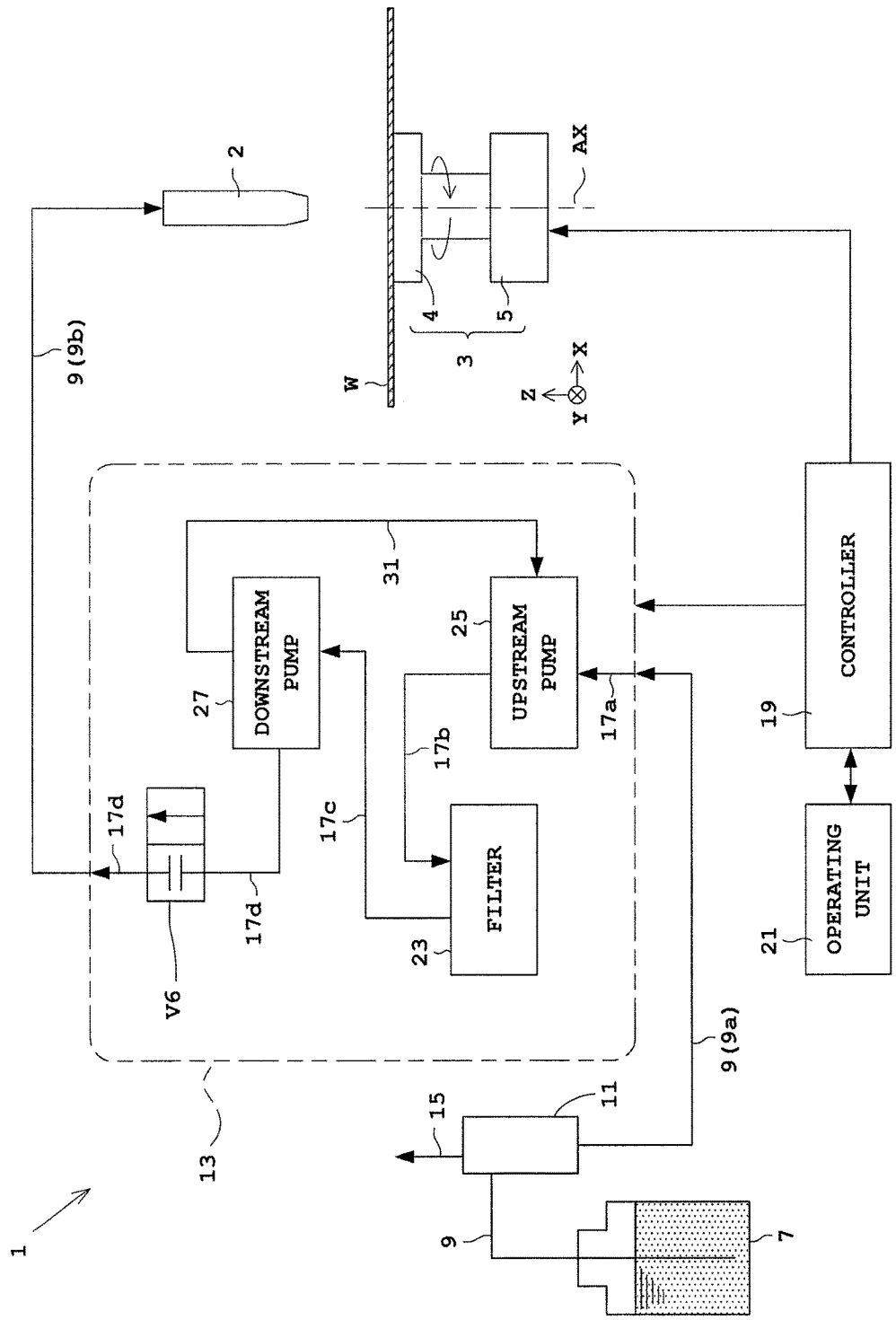
FIG. 2 schematically illustrates a substrate treating apparatus according to one embodiment of the present invention.

The following describes one embodiment of the present invention with reference to drawings. FIG. 2 schematically illustrates a substrate treating apparatus.

<Configuration of Substrate Treating Apparatus>

Reference is made to FIG. 2. A substrate treating apparatus 1 includes a nozzle 2 and a holding rotator 3. The nozzle 2 dispenses a processing liquid to a substrate W. Examples of the processing liquid to be used include a photoresist liquid, chemicals for antireflection film formation, a developer, and a rinse liquid such as solvent and deionized water (DiW). The holding rotator 3 holds and rotates the substrate W in a substantially horizontal attitude.

The holding rotator 3 includes a spin chuck 4 and a turning drive unit 5. The spin chuck 4 holds the substrate W such that the substrate W is rotatable around a rotation axis AX. The spin chuck 4 suction-holds a back side of the substrate W, for example, thereby holding the substrate W in the substantially horizontal attitude. On the other hand, the turning drive unit 5 drives the spin chuck 4 such that the spin chuck 4 turns around the rotation axis AX. The turning drive unit 5 includes an electric motor.

The substrate treating apparatus 1 further includes a processing liquid supplying source 7, a processing liquid pipe 9, a trap tank 11, and a pump apparatus 13. The processing liquid supplying source 7 includes a tank that stores the processing liquid. The processing liquid supplying source 7 supplies the processing liquid to the nozzle 2 through the processing liquid pipe 9. The trap tank 11 and the pump apparatus 13 are inserted into the processing liquid pipe 9 in this order from a side adjacent to the processing liquid supplying source 7.

The trap tank 11 stores the processing liquid temporarily, and detects a remaining quantity of processing liquid in the processing liquid supplying source 7. The trap tank 11 is provided with an optical remaining quantity detector (not shown). The trap tank 11 is also provided with a drain 15. The drain 15 is a waste liquid line that discharges air bubbles or the processing liquid containing the air bubbles. The drain 15 has an open/close valve, not shown, inserted therein.

The pump apparatus 13 supplies the processing liquid to the nozzle 2. In the pump apparatus 13, the processing liquid flows through processing liquid flow paths 17a to 17d. The pump apparatus 13 performs supply and stops the supply of the processing liquid with an open/close valve V6, which is to be mentioned later. The pump apparatus 13 is also to be mentioned later in detail.

The substrate treating apparatus 1 further includes a controller 19 and an operating unit 21. The controller 19 includes a central processing unit (CPU) and the like. The controller 19 controls each element of the substrate treating apparatus 1. The operating unit 21 includes a display unit, a memory unit, an input unit, and the like. The display unit includes a liquid crystal monitor. The memory unit includes a ROM (Read-only Memory), a RAM (Random-Access Memory), a hard disk, and the like. The input unit includes a keyboard, a mouse, and various types of buttons. Various conditions for a substrate treatment are stored in the memory unit.

<Configuration of Pump Apparatus>

Figure 3:
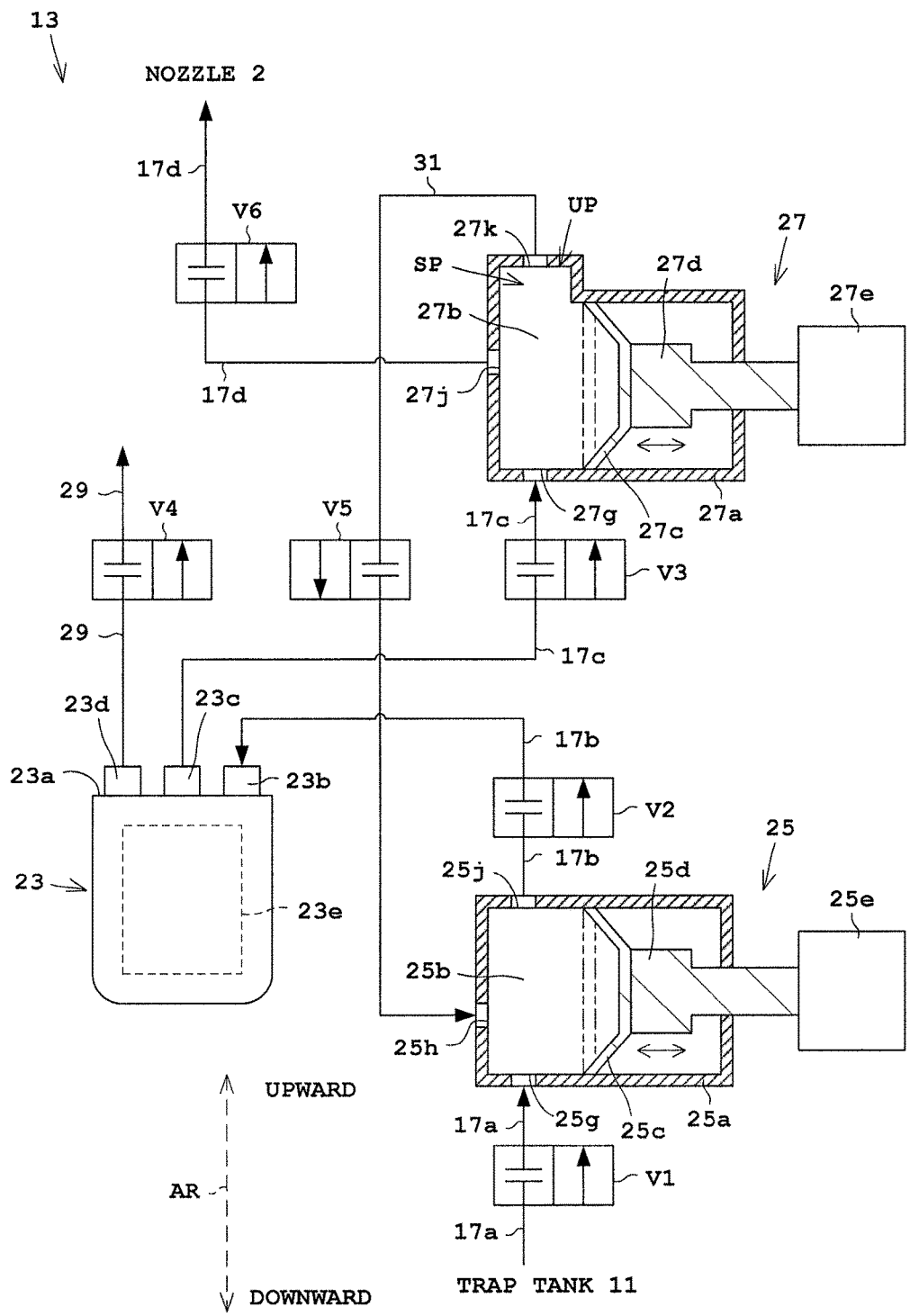
FIG. 3 illustrates a level relationship of a pump apparatus.

The following describes the pump apparatus 13 with reference to FIG. 3. FIG. 3 illustrates a level relationship of the pump apparatus 13. In the drawing, an arrow AR indicates an upward/downward direction. The pump apparatus 13 includes a filter 23, an upstream pump (also referred to as a fill pump) 25, and a downstream pump (also referred as a dispense pump) 27. The pump apparatus 13 causes the processing liquid to flow upward.

The filter 23 is inserted into the processing liquid flow paths 17b and 17c through which the processing liquid flows. The upstream pump 25 is disposed upstream of the filter 23, and is inserted into the processing liquid flow paths 17a and 17b. Moreover, the downstream pump 27 is disposed downstream of the filter 23, and is inserted into the processing liquid flow paths 17c and 17d. That is, the filter 23 is inserted between the upstream pump 25 and the downstream pump 27.

The upstream pump 25 and the downstream pump 27 supply the processing liquid in combination with operations of open/close valves V1 to V6. The open/close valve V1 is inserted into the processing liquid flow path 17a. The open/close valve V2 is inserted into the processing liquid flow path 17b. The open/close valve V3 is inserted into the processing liquid flow path 17c. The open/close valve V4 is inserted into a drain flow path 29, which is to be mentioned later. The open/close valve V5 is inserted into a return flow path 31, which is to be mentioned later. The open/close valve V6 is inserted into the processing liquid flow path 17d. Here, the open/close valves V1 to V6 are not limited to normally closed valves, but are each formed for a known valve.

The following firstly describes the upstream pump 25. The upstream pump 25 supplies the processing liquid. The upstream pump 25 includes a casing 25a, an intra-upstream pump flow path 25b, a diaphragm 25c, a piston 25d, and an electric motor 25e.

Here, a center part of the diaphragm 25c is fixed on the piston 25d, whereas an outer periphery of the diaphragm 25c is fixed on an inner wall of the casing 25a. In FIG. 3, the processing liquid flowing through the intra-upstream pump flow path 25b never flows rightward from the diaphragm 25c. This is similarly applicable to a diaphragm 27c mentioned later. The piston 25d reciprocates in a horizontal direction in FIG. 3. The electric motor 25e drives the piston 25d. The electric motor 25e generates rotation. The rotation is converted into linear movement of the piston 25d in the horizontal direction by a conversion mechanism such as a screw shaft or a nut. The linear movement of the piston 25d in the horizontal direction causes the diaphragm 25c to deform as indicated by solid lines or chain double-dashed lines. As a result, the processing liquid is sucked into the intra-upstream pump flow path 25b, and is supplied out through the intra-upstream pump flow path 25b. Here, the electric motor 25e is, for example, formed by a stepping motor.

The upstream pump 25 includes an inlet 25g, a return inlet 25h, and an outlet 25j. The inlet 25g is connected to the processing liquid flow path 17a. The processing liquid supplied through the processing liquid flow path 17a flows into the intra-upstream pump flow path 25b via the inlet 25g. The return inlet 25h is connected to a return flow path 31, which is to be mentioned later. The processing liquid supplied through the return flow path 31 flows into the intra-upstream pump flow path 25b via the return inlet 25h. The outlet 25j is connected to the processing liquid flow path 17b. The processing liquid supplied through the intra-upstream pump flow path 25b flows into the processing liquid flow path 17b via the outlet 25j.

In FIG. 3, the inlet 25g is disposed on an undersurface of the intra-upstream pump flow path 25b, whereas the outlet 25j is disposed on a top face of the intra-upstream pump flow path 25b. Here, both the inlet 25g and the outlet 25j may each be disposed on a side face of the intra-upstream pump flow path 25b (e.g., a side face where the return inlet 25h is disposed). Moreover, the return inlet 25h is disposed on the side face of the intra-upstream pump flow path 25b. However, the return inlet 25h may be disposed on the undersurface of the intra-upstream pump flow path 25b.

Moreover, the outlet 25j of the upstream pump 25 is disposed higher in level than the inlet 25g and the return inlet 25h. This causes the air bubbles in the upstream pump 25 to be vented readily. That is, air bubbles are readily movable to the outlet 25j of the upstream pump 25. Here, the inlet 25g and the return inlet 25h may be disposed at the same level.

The following describes the filter 23. The filter 23 is detachable to the pump apparatus 13 and thus is replaceable. The filter 23 includes a top face 23a with an inlet 23b, an outlet 23c, and a vent 23d. The processing liquid flow path 17b is connected to the inlet 23b. The processing liquid flow path 17c is connected to the outlet 23c. The drain flow path 29 that drains the air bubbles is connected to the vent 23d. The vent 23d is an outlet for draining air bubbles within the filter 23. This causes the air bubbles to be drained in midstream of the supply path for the processing liquid. Here, the vent 23d may drain air bubbles together with the processing liquid.

Moreover, the inlet 23b of the filter 23 is disposed higher in level than the outlet 25j of the upstream pump 25. The inlet 23b of the filter 23 is disposed on the top face 23a of the filter 23, whereby the processing liquid flow path 17b is directed downward in midstream thereof. The air bubbles easily remains at this part where the processing liquid flow path 17b is directed downward. However, the filter 23 is disposed higher in level than the upstream pump 25. Consequently, the air bubbles are relatively easily vented from the upstream pump 25 to the filter 23. Accordingly, this suppresses remaining of the air bubble in midstream of the processing liquid flow path 17b.

Moreover, the filter 23 further includes a filter main body 23e. The filter main body 23e actually filtrates the processing liquid in the filter 23.

The following describes the downstream pump 27. Similar to the upstream pump 25, the downstream pump 27 supplies the processing liquid. The downstream pump 27 includes a casing 27a, an intra-downstream pump flow path 27b, the diaphragm 27c, a piston 27d, and an electric motor 27e. The intra-downstream pump flow path 27b corresponds to the intra-pump flow path in the present invention.

The diaphragm 27c has a center part fixed on the piston 27d, and has an outer periphery fixed on an inner wall of the casing 27a. The piston 27d allows reciprocation in the horizontal direction in FIG. 3. The electric motor 27e drives the piston 27d. The electric motor 27e generates rotation, and the rotation is converted to a linear movement of the piston 27d in the horizontal direction by a conversion mechanism, such as a screw shaft or a nut. The linear movement of the piston 27d in the horizontal direction causes the diaphragm 27c to deform as indicated by solid lines and chain double-dashed lines. As a result, the processing liquid is sucked into the intra-downstream pump flow path 27b, and is supplied through the intra-downstream pump flow path 27b. Here, the electric motor 27e is, for example, formed by a servomotor. In addition, the electric motors 25e and 27e may each be another type of electric motors.

Moreover, a space SP collecting the processing liquid at a higher position than the diaphragm 27c may be provided to achieve ready collection of air bubbles.

Moreover, the downstream pump 27 further includes an inlet 27g, a supply outlet 27j, and a return outlet 27k. The processing liquid flow path 17c is connected to the inlet 27g. The processing liquid supplied from the processing liquid flow path 17c flows into the intra-downstream pump flow path 27b via the inlet 27g.

The inlet 27g of the downstream pump 27 is disposed higher in level than the outlet 25j of the upstream pump 25.

In addition, the inlet 27g is also disposed higher in level than the outlet 23c of the filter 23. That is, the downstream pump 27 is disposed higher than the upstream pump 25 and the filter 23. Accordingly, this allows the processing liquid to flow upward, leading to suppressed remaining of the processing liquid in midstream of the supply path. Moreover, the processing liquid flow path 17c is connected to the inlet 27g of the downstream pump 27 while extending at least either horizontally or upward from the outlet 23c of the filter 23 without extending downward. Consequently, the air bubbles are readily vented from the processing liquid flow path 17c for the processing liquid.

The processing liquid flow path 17d is connected to the supply outlet 27j. Similarly, the processing liquid flow path 17d is connected to the processing liquid pipe 9 (see FIG. 2) while extending at least either horizontally or upward from the supply outlet 27j without extending downward. Moreover, the supply outlet 27j is disposed lower in level than an upper end (or a top face) UP of the intra-downstream pump flow path 27b. That is, the supply outlet 27j is disposed lower in level and spaced away from the upper end UP of the intra-downstream pump flow path 27b. In FIG. 3, the supply outlet 27j is disposed on the side face of the intra-downstream pump flow path 27b. This causes the air bubbles in the processing liquid to flow upward around the upper end UP. Consequently, the air bubbles are prevented from flowing out of the supply outlet 27j disposed lower in level than the upper end UP of the intra-downstream pump flow path 27b.

The return outlet 27k is connected to the return flow path 31. That is, the return flow path 31 for returning the processing liquid from the return outlet 27k of the downstream pump 27 to the upstream pump 25 is connected between the downstream pump 27 and the upstream pump 25. Here, the return outlet 27k is disposed higher in level than the supply outlet 27j. This allows the air bubbles to return from the return outlet 27k of the downstream pump 27 to the upstream pump 25. In other words, the processing liquid is circulatable among the upstream pump 25, the filter 23, and the downstream pump 27. Consequently, air bubbles are removable by returning the processing liquid containing the air bubbles in the downstream pump 27 to the upstream pump 25 and passing the processing liquid again through the filter 23.

In addition, the return outlet 27k is disposed on the upper end (or the top face) UP of the intra-downstream pump flow path 27b of the downstream pump 27. Accordingly, the air bubbles in the processing liquid that floats and are collected around the upper end UP of the intra-downstream pump flow path 27b are able to flow into the return flow path 31. Here in FIG. 3, the return outlet 27k is disposed on the upper end UP of the intra-downstream pump flow path 27b. However, the return outlet 27k may be disposed on the side face of the intra-downstream pump flow path 27b where the supply outlet 27j is provided. In this case, the return outlet 27k may be disposed at a level (almost flush with the upper end UP) to contact the upper end UP.

Moreover, the return outlet 27k is disposed higher in level than the inlet 27g. This allows the downstream pump 27 to supply the air bubbles to the return outlet 27k readily.

The electric motor 27e moves the diaphragm 27c. This causes the processing liquid from the intra-downstream pump flow path 27b to be supplied to the processing liquid flow path 17d via the supply outlet 27j or to be supplied to the return flow path 31 via the return outlet 27k.

<Operation of Substrate Treating Apparatus>

The following describes operation of the substrate treating apparatus 1. In FIG. 2, a substrate transport mechanism, not shown, transports the substrate W onto the holding rotator 3. The holding rotator 3 suction-holds a back side of the substrate W. Then, a nozzle transport mechanism not shown moves the nozzle 2 from a standby position outside the substrate W to a given dispensation position above the substrate W.

After moving the nozzle 2, the controller 19 opens an open/close valve V6 to dispense the processing liquid to the substrate W through the nozzle 2. Here, the controller 19 performs control to rotate the substrate W and dispense the processing liquid in accordance with treatment conditions. The processing liquid supplying source 7 supplies the processing liquid to the nozzle 2 through the processing liquid pipe 9. In midstream, the processing liquid is supplied to the trap tank 11 and the pump apparatus 13 in this order. Thereafter, the processing liquid is dispensed to the substrate W through the nozzle 2. After a substrate treatment is performed, the nozzle moving mechanism moves the nozzle 2 from the dispensation position above the substrate W to the standby position. Then, the holding rotator 3 releases its suction of the substrate W while stopping rotation of the substrate W. The substrate transport mechanism moves the substrate W on the holding rotator 3 to another device.

Figure 4:
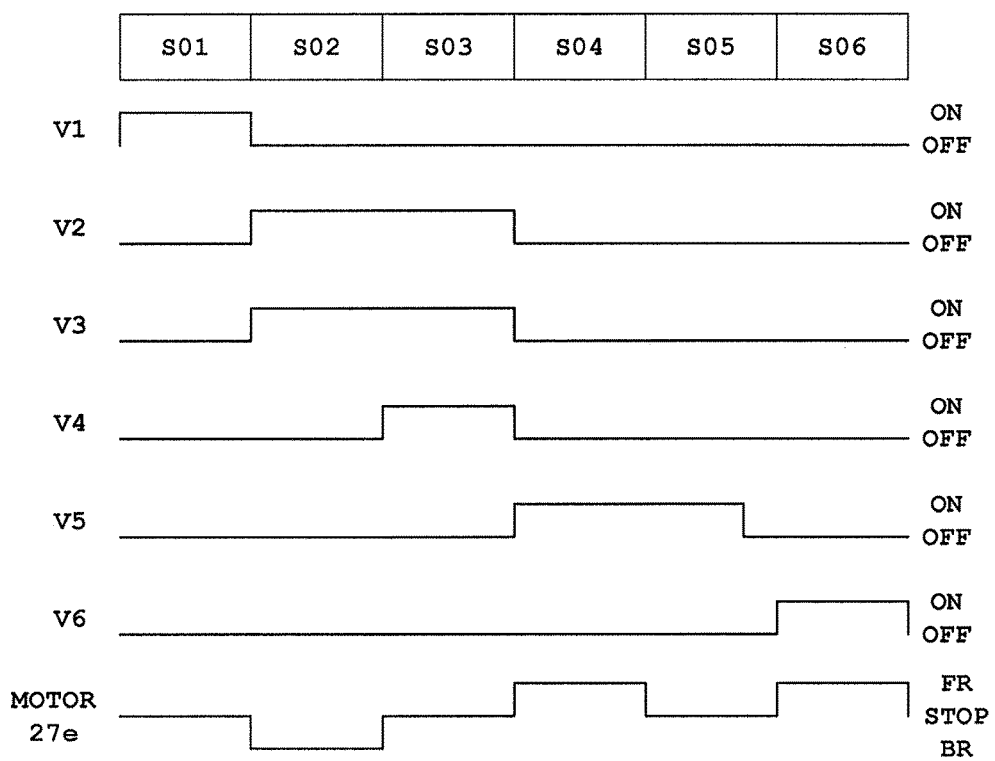
FIG. 4 illustrates one example of operation of an open/close valve and the like in the pump apparatus.

The following describes operation of the pump apparatus 13. As in FIG. 3, the pump apparatus 13 causes the processing liquid to flow upward. Accordingly, even when the processing liquid contains air bubbles, the air bubbles are less likely to remain in midstream of the supply path and thus are easily drained. FIG. 4 illustrates one example of operation of the open/close valve and the like in the pump apparatus 13.

In Step S01 in FIG. 4, the diaphragm 25c is moved rightward in FIG. 3. At this time, the open/close valve V1 is open (ON), whereas the open/close valves V2 and V5 are closed (OFF). This causes the processing liquid to be sucked from the processing liquid flow path 17a into to the intra-upstream pump flow path 25b via the inlet 25g.

In Step S02, the diaphragm 25c is moved leftward in FIG. 3. At this time, the open/close valves V2 and V3 are open, whereas the open/close valves V1 and V4 to V6 are closed. This causes the processing liquid to be supplied from the intra-upstream pump flow path 25b to the processing liquid flow path 17b via the outlet 25j. The processing liquid into the processing liquid flow path 17b is supplied to the inlet 23b, the filter main body 23e, and then outlet 23c of the filter 23, in this order, and thereafter supplied to the processing liquid flow path 17c. In the filter main body 23e, impurities such as the air bubbles are removed. The processing liquid into the processing liquid flow path 17c is supplied to the intra-downstream pump flow path 27b via the inlet 27g of the downstream pump 27. In the Step S02, the electric motor 27e of the downstream pump 27 rotates backward to move the diaphragm 27c rightward in FIG. 3.

In Step S03, the processing liquid is continuously supplied from the upstream pump 25 to the downstream pump 27. In addition, in the Step S03, the open/close valve V4 is open. Accordingly, the processing liquid is supplied to the drain flow path 29 via the vent 23d. The processing liquid flowing into the drain flow path 29 is one before passing through the filter main body 23e. Consequently, the processing liquid containing the air bubbles drains to the drain flow path 29 entirely together with the air bubbles. Here in the Step S03, the electric motor 27e of the downstream pump 27 stops its rotation.

In Step S04, the processing liquid is supplied out from the return outlet 27k of the downstream pump 27. At this time, the air bubbles collected around the upper end UP are also supplied out. The electric motor 27e of the downstream pump 27 rotates forward at a given rotation amount to move the diaphragm 27c leftward in FIG. 3. At this time, the open/close valve V5 is opened, whereas the other open/close valves V1 to V4 and V6 are closed. The processing liquid from the return outlet 27k flows into the return flow path 31 and the return inlet 25h of the upstream pump 25, in this order, and then returns to the intra-upstream pump flow path 25b. In addition, the processing liquid having returned into the upstream pump 25 is supplied again to the filter 23 through subsequent operation, whereby the air bubbles are removed.

In Step S05, the processing liquid is continuously supplied out from the return outlet 27k of the downstream pump 27. At this time, the open/close valve V5 is open. On the other hand, the electric motor 27e of the downstream pump 27 stops its rotation.

In Step S06, the processing liquid is supplied out from the downstream pump 27 via the supply outlet 27j. The electric motor 27e of the downstream pump 27 rotates forward to move the diaphragm 27c leftward in FIG. 3. At this time, the open/close valve V6 is opened, whereas the other open/close valves V1 to V5 are closed. The processing liquid supplied out from the downstream pump 27 is dispensed from the nozzle 2 in FIG. 2 through the processing liquid pipe 9b.

After the Step S06, the process returns to the Step S01, and repeats the Steps S01 to S06.

With the embodiment of the present invention, the pump apparatus 13 includes the upstream pump 25, the filter 23, and the downstream pump 27 inserted into the processing liquid flow paths 17a to 17d in this order. The downstream pump 27 has the inlet 27g higher in level than the outlet 25j of the upstream pump 25 and higher in level than the outlet 23c of the filter 23. That is, the downstream pump 27 is disposed higher in level than the upstream pump 25 and the filter 23. Accordingly, this allows the processing liquid to flow upward. Even when air bubbles are generated in the processing liquid, buoyancy causes the air bubbles to move upward in the processing liquid flow paths 17b and 17c and collect the air bubbles on the downstream side. Consequently, the air bubbles are readily vented from the processing liquid flow paths 17b and 17c. As a result, the air bubbles are easily vented in the supply path for the processing liquid.

The present invention is not limited to the foregoing examples, but may be modified as follows.

(1) In the embodiment mentioned above, the first end of the return flow path 31 is connected to the return outlet 27k of the downstream pump 27. In addition, the second end of the return flow path 31 is connected to the return inlet 25h of the upstream pump 25. However, the second end of the return flow path 31 may be connected to a front stage (upstream) of the upstream pump 25. For instance, the second end of the return flow path 31 may be connected to any of the processing liquid flow path 17a, the processing liquid pipe 9a, and the trap tank 11. When the second end of the return flow path 31 is connected to the trap tank 11, the drain 15 allows the air bubbles to drain.

(2) In the embodiment and the modification (1) mentioned above, the pump apparatus 13 operates as in FIG. 4, but the operation is not limitative. For instance, the upstream pump 25 and the downstream pump 27 may each include a check valve so as to prevent backflow of the processing liquid, and may operate as under.

The following is detailed description. In the pump apparatus 13, the inlet 25g, the return inlet 25h, and the outlet 25j of the upstream pump 25 each have a check valve to prevent backflow of the processing liquid. In addition, the inlet 27g, the supply outlet 27j, and the return outlet 27k of the downstream pump 27 each have a check valve.

When the processing liquid supplying source 7 supplies the processing liquid to the nozzle 2, the open/close valves V1 to V3 are opened, and the open/close valves V4 to V6 are closed. At this time, the electric motor 25e of the upstream pump 25 and the electric motor 27e of the downstream pump 27 are in action, and the diaphragms 25c and 27c reciprocate. Thereafter, when the open/close valve V6 is opened under such a condition, the processing liquid flows toward the nozzle 2.

When the processing liquid circulates among the upstream pump 25, the filter 23, and the downstream pump 27, the open/close valves V2, V3, and V5 are opened, whereas the open/close valves V1, V4, and V6 are closed. Consequently, this causes the processing liquid to return back from the intra-downstream pump flow path 27b through the return outlet 27k, the return flow path 31, the return inlet 25h, in this order, to the intra-upstream pump flow path 25b. Such circulation achieves control of pressure between the upstream pump 25 and the downstream pump 27 for supplying the processing liquid.

When the filter 23 drains the air bubbles, the open/close valve V4 is opened. At this time, the open/close valves V1 and V2 are opened, whereas the open/close valves V3, V5, and V6 are closed. In addition, operating the electric motor 25e causes the air bubble to drain together with the processing liquid from inside the filter 23 through the vent 23d and the drain flow path 29.

(3) In the embodiment and the modifications mentioned above, the upstream pump 25 and the downstream pump 27 are each of a diaphragm type, but may be of another known type. For instance, the upstream pump 25 and the downstream pump 27 may be of a piston type. In this case, the downstream pump 27 may include a piston 27d that is slidable along an inner wall of the casing 27a via an O-ring (not shown). This is similarly applicable to the upstream pump 25.

(4) In the embodiment and the modifications mentioned above, the casing 25a of the upstream pump 25, the casing 27a of the downstream pump 27, and the processing liquid flow paths 17a to 17d are preferably formed individually in separated blocks without in the same block for obtaining an enhanced degree of freedom of arrangement. Here, the processing liquid flow paths 17a to 17d may each be a pipe. Moreover, each of the blocks may be made of fluorine plastics such as PFA (perfluoroalkoxy alkane).

(5) In the embodiment and the modifications mentioned above, the holding rotator 3 has been described as one example of a holding/moving unit that holds and moves the substrate W relative to the nozzle 2. The holding/moving unit may move the substrate W one-dimensionally along the surface of the substrate W or two-dimensionally.

(6) In the embodiment and the modifications mentioned above, the filter 23 includes the inlet 23b, the outlet 23c, and the vent 23d on its top face 23a. For instance, the inlet 23b may be disposed on the side face of the filter 23. This allows prevention of the processing liquid flow path 17b in FIG. 3 from being directed downward around the inlet 23b. Accordingly, the difficulty in removal of the air bubbles is suppressed, the difficulty being caused by the downward directed processing liquid flow path 17b. In this case, the processing liquid flow path 17b is connected to the inlet 23b while extending at least either horizontally or upward from the outlet 25*j* of the upstream pump 25 without extending downward.

The present invention may be embodied in other specific forms without departing from the spirit or essential attributes thereof and, accordingly, reference should be made to the appended claims, rather than to the foregoing specification, as indicating the scope of the invention.

What is claimed is:

1. A pump apparatus for supplying a processing liquid, the pump apparatus comprising:
    a filter inserted into a processing liquid flow path through which the processing liquid flows;
    an upstream pump disposed upstream of the filter and inserted into the processing liquid flow path;
    a downstream pump disposed downstream of the filter and inserted into the processing liquid flow path, the downstream pump having an inlet higher in level than an outlet of the upstream pump and higher in level than an outlet of the filter; and
    a return flow path connected between the downstream pump and the upstream pump for returning the processing liquid from a return outlet of the downstream pump to a return inlet of the upstream pump,
    the outlet of the upstream pump being disposed higher in level than an inlet of the upstream pump and the return inlet of the upstream pump,
    the return inlet of the upstream pump being disposed at the same level as or higher in level than the inlet of the upstream pump,
    the return outlet of the downstream pump being disposed higher in level than a supply outlet of the downstream pump.

2. The pump apparatus according to claim 1, wherein the processing liquid flow path is connected to the inlet of the downstream pump while extending from the outlet of the filter at least either horizontally or upward without extending downward.

3. The pump apparatus according to claim 1, wherein the supply outlet of the downstream pump is connected to the processing liquid flow path, and the supply outlet is disposed lower in level than an upper end of an intra-pump flow path of the downstream pump.

4. The pump apparatus according to claim 1, wherein the filter includes a vent that exhausts air bubbles.

5. The pump apparatus according to claim 1, wherein the return outlet is disposed at a level to contact the upper end of the intra-pump flow path of the downstream pump.

6. The pump apparatus according to claim 1, wherein an inlet of the filter is disposed higher in level than the outlet of the upstream pump.

7. A substrate treating apparatus for treating a substrate, the substrate treating apparatus comprising:
    a nozzle that dispenses a processing liquid to the substrate; and
    a pump apparatus that supplies the processing liquid to the nozzle, wherein
    the pump apparatus comprising:
    a filter inserted into a processing liquid flow path through which the processing liquid flows;
    an upstream pump disposed upstream of the filter and inserted into the processing liquid flow path;
    a downstream pump disposed downstream of the filter and inserted into the processing liquid flow path, the downstream pump having an inlet higher in level than an outlet of the upstream pump and higher in level than an outlet of the filter; and
    a return flow path connected between the downstream pump and the upstream pump for returning the processing liquid from a return outlet of the downstream pump to a return inlet of the upstream pump,
    the outlet of the upstream pump being disposed higher in level than an inlet of the upstream pump and the return inlet of the upstream pump,
    the return inlet of the upstream pump being disposed at the same level as or higher in level than the inlet of the upstream pump,
    the return outlet of the downstream pump being disposed higher in level than a supply outlet of the downstream pump.

* * * * *